US005489861A

United States Patent [19]
Seymour

[11] Patent Number: 5,489,861
[45] Date of Patent: Feb. 6, 1996

[54] HIGH POWER, EDGE CONTROLLED OUTPUT BUFFER

[75] Inventor: Michael J. Seymour, South Portland, Me.

[73] Assignee: National Semiconductor Corporation, Santa Clara, Calif.

[21] Appl. No.: 170,511

[22] Filed: Dec. 20, 1993

[51] Int. Cl.⁶ .......................... H03K 17/04; H03K 19/08
[52] U.S. Cl. .......................... 327/108; 327/379; 327/483; 327/575; 326/85; 326/87; 326/91
[58] Field of Search .................................... 307/446, 315, 307/263, 495, 499, 473, 570, 572, 270, 544; 327/483, 575, 432, 433, 170, 310, 376, 377, 108, 379, 384; 326/85, 87, 91, 26, 27

[56] References Cited

U.S. PATENT DOCUMENTS

| 3,912,946 | 10/1975 | Graziadei | 327/312 |
|---|---|---|---|
| 3,961,206 | 6/1976 | Lau | 307/315 |
| 4,627,081 | 12/1986 | Gay | 307/315 |
| 4,779,014 | 10/1988 | Masuoka et al. | 307/270 |
| 4,845,386 | 7/1989 | Ueno | 326/110 |
| 5,124,582 | 6/1992 | Nakamura et al. | 327/433 |
| 5,138,195 | 8/1992 | Satou et al. | 326/27 |
| 5,223,745 | 6/1993 | Ohannes et al. | 326/27 |
| 5,233,237 | 8/1993 | Ohannes et al. | 307/446 |
| 5,287,021 | 2/1994 | Obregon et al. | 327/433 |
| 5,311,077 | 5/1994 | Brown | 307/446 |

Primary Examiner—Timothy P. Callahan
Assistant Examiner—Terry L. Englund
Attorney, Agent, or Firm—Thomas L. Bohan; Chris A. Caseiro

[57] ABSTRACT

An output buffer circuit with edge-rate control capable of maintaining both rising and falling edge-rates within narrow specifications in the face of wide variations in load impedance. In particular, the output buffer of the present invention is intended for coupling to a common bus whereby it may be presented with very low resistive impedance loads and varying capacitive loads. The control schemes for both the pull-up and the pull-down parts of the circuit of the present invention utilize in part fixed currents charging a selected capacitance in order to achieve a metering of the charging or discharging current at the buffer's output. For the pull-down part of the circuit a dual MOS/Bipolar pull-down scheme is used, with the MOS transistors sequentially turning on in a gradual fashion so as to smooth the onset of current sinking. Subsequently, after a measured delay, a bipolar pull-down transistor is turned on. There is also a contingent bipolar pull-down transistor to aid in switching the buffer output from logic-high to logic-low if the MOS transistors and first bipolar transistor acting together are not sufficient. Later, as current-sinking is being turned off, there is again a sequential deactivation of the pull-down transistors so as to round the turn-off curve. The dual MOS/bipolar pull-down scheme provides a degree of temperature compensation of the pull-down current and a lower output capacitance than when one type of transister is used.

25 Claims, 6 Drawing Sheets

HIGH POWER, EDGE CONTROLLED OUTPUT BUFFER

BACKGROUND OF THE INVENTION

1. Field of the Invention

The present invention relates to output buffer circuits. In particular, it relates to output buffer circuits with current-sourcing and current-sinking edge-rate control. More particularly, it relates to buffers with edge-rate control sufficient to significantly increase data-transmission speeds for a wide range of transmission line (bus) impedance presented to the buffers' current-sourcing/sinking node. Specifically, the present invention produces a high-current-capacity, edge-rate-controlled output buffer which maintains edge rates within a narrow temporal range, irrespective of bus load. Furthermore, the present invention accomplishes such edge-rate control with little or no increase in output capacitance or load dependence and with a definite decrease in power dissipation, cross-talk, and EMI in comparison with comparable current-capacity output buffer circuits lacking edge-rate control. Most particularly, the present invention relates to TTL-compatible output buffer circuits capable of driving buses to logic-high and logic-low levels with sufficient current capacity to ensure "incident wave switching" over a wide range of bus impedance and with very favorable output capacitance, power dissipation and noise.

2. Description of the Prior Art

The prior art consists of TTL-compatible output buffers lacking edge-rate control. Buffers lacking such control can effect H→L and L→H transitions at their current sourcing/sinking output nodes which are very short compared with the other factors determining total propagation time between buffer input and buffer output. Indeed, these transitions are too fast in the sense that they give rise to various effects deleterious to efficient data transfer, effects including electromagnetic interference (EMI), "cross talk" between circuits, and output ringing. Because of these consequences of very short H⇆L switching times, increasingly narrow specifications and emerging standards set out narrow "windows" within which a buffer's output edge rates—rising and falling—must fall for a specified wide range of bus impedances. In addition, these edge rate specifications must be met over the entire operating temperature range—generally, −55° to +125° C.—and must be stable in the face of power supply fluctuations.

Solutions of the problem involving a straightforward lengthening of the transition times by, for example, introducing more capacitance on the output node, are precluded, since such an approach makes the buffer prone to overly long transitions in the presence of certain commonly-occurring load conditions. Indeed, once circuitry is introduced to lengthen the transition times, the edge rate displays a dependence on output load that it did not display previously. Therefore, any design changes directed at achieving a controlled edge rate must also address the problem of load dependence. Stated differently, any implementation of a lengthened transition time at the output node must provide for a high current capacity at those lengthened times, especially for the H→L shift. Addressing this aspect of the design problem by simply installing larger output transistors will not work. With MOS pulldown transistors, ensuring high current capacity up to the high end of the specified temperature range requires very large transistors and hence very large capacitances. Very large capacitance at each output node attached to the bus means that an even higher pulldown current capacity is needed, and so forth. With bipolar pulldown transistors, on the other hand, the pulldown circuit must provide for a very high current capacity at room temperature in order to meet the current capacity requirement at the lower end of the temperature range where the bipolar transistor current capacity falls off significantly. Since power dissipation in bipolar transistors is proportional to current, meeting the tighter edge-rate specifications with bipolar pulldown transistors requires a power dissipation level inconsistent with the ever more densely-packed integrated circuitry being designed.

Therefore, what is needed is a TTL-compatible output buffer that incorporates affirmative edge rate control so that the transition waveforms are held within narrow limits over a wide load impedance range, in particular a control which slows down transition times while maintaining sufficient load independence. What is also needed is that such a buffer satisfies these conditions over a broad temperature range-from −55° to +125° C. and that it do this with no increase in buffer output capacitance or power dissipation. The same is true of the edge rate constancy in the face of power supply voltage fluctuations. Finally, what is needed is a buffer design ensuring that these characteristics are maintained independent of normal manufacturing process variations.

SUMMARY OF THE INVENTION

The present invention achieves output edge-rate slowing by coupling the output voltage variation rate to the rate at which an internally-generated fixed current charges a fixed capacitance. By using both MOS and bipolar transistors in the pull-down circuit, the present invention is able to ensure a high current capacity—and hence load independence—while minimizing output capacitance and power dissipation. In addition to controlling the primary edge rate of its output signal, the buffer of the present invention introduces sequential switching of current sources and sinks in order to "round" the otherwise steep changes at the beginning and ending of a transition.

Since the present invention relates to how a buffer in its active mode effects output transitions in response to input transitions, it is possible and desirable in describing the invention to dispense with the enabling circuitry otherwise found in three-state output buffers. The two-state buffer circuits used for illustrative purposes in this section can be seen to be equivalent to "enabled" three-state buffer circuits. The discussion will be addressed to the pull-up and pull-down stages separately so as to further clarify the circuitry. It is of course to be understood that in practice the separate pull-up and pull-down stages will be joined together with a single input and single output.

Edge-Controlled Pull-Up Stage

The primary edge-rate control burden to be met with the pull-up stage is that of slowing it down. Regardless of the speed of the input transition, the L→H transition at the output to the bus must commence smoothly and continue at a measured rate, independent of the bus characteristics. Otherwise ringing deleterious to the operation of the other circuits coupled to the bus may occur.

Figure 1:
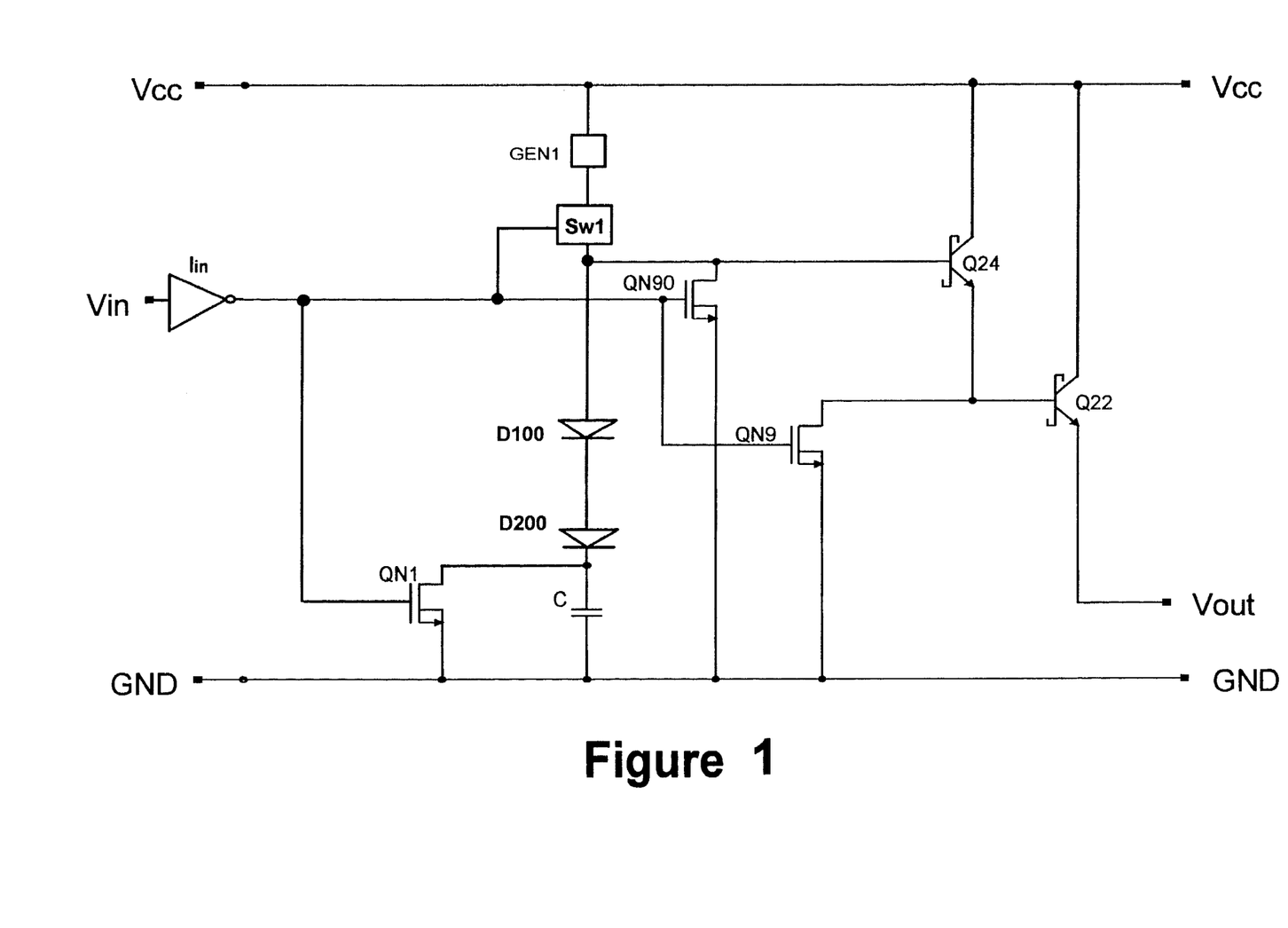
FIG. 1 depicts the main features of the pull-up sub-circuit of the present invention.

FIG. 1 shows a simplified two-state buffer circuit incorporating a basic version circuit of the present invention as it relates to pull-up control. It can be seen to have standard Darlington pair of bipolar transistors Q24 and Q22 supplying the current to Vout (and thence to the bus) during the current-sourcing phase of the buffer's operation. Of interest here is the manner in which the buffer output connection is changed from logic-low to logic-high, i.e., the shape of the rising-edge waveform. This transition can be viewed as a staged voltage increase in three parts: the beginning, during which the Darlington pair is turned on; the middle, during which essentially all of the output voltage change occurs; and the end, where the rising edge slopes over to maintain the current-sourcing needed to maintain the logic-high voltage at Vout. Of related interest is how the pull-up circuit shuts down, as—or just before—the pull-down circuit turns on.

With continuing reference to FIG. 1, it is seen that the input stage is a simple inverter Iin. The output of this inverter stage is connected to the edge-control stage consisting of a switch Sw1, a current generator GEN1, and a capacitive element C to be charged by GEN1 through two diodes coupled in series. The output section of the circuit is the Darlington pair Q24 and Q22.

When the input voltage to this circuit Vin changes from logic-low to logic-high the output of the inverter Iin changes—after a delay T—from logic-high to logic-low. The switch Sw1, held off while Vin was logic-low, is such that it is turned on immediately by the change in the output of inverter Iin. The current generator GEN1 is constructed by known techniques so as to provide a particular current I1 once the switch Sw1 is turned on. This current I1 is for the most part a constant current. By design, in this invention, the junctions of diodes D100 and D200 have i-v characteristics similar to those of the base-emitter junctions of the transistors forming the Darlington pair: Q24 and Q22. When this is the case, then the current I1 turns on both members of the Darlington pair just prior to the capacitive element C beginning to charge. (I.e., only when the rising voltage caused by the current I1 reaches $2V_{BE}$—where $V_{BE}$ is the drop across a forward biased diode or base-emitter junction, assumed to be the same for all bipolar transistors in this circuit—will current flow through D100 and D200 and hence onto C.) The low parasitic capacitance associated with the bipolar transistors ensures that the Darlington pair will very quickly reach their turn-on voltage when driven by I1. Once current begins flowing through D100 and D200 to charge C, the base voltage $V_{ND1}$ of the first Darlington transistor Q24 will change linearly, and at a (much slower) rate determined by the controlled current I1. I.e., $$dV_{ND1}/dt=I1/C, \quad (1)$$

where in this expression, C is the magnitude of the capacitance of capacitor C. At any given time, the resulting magnitude of the base voltage of Q24 will be equal to the voltage on capacitor C plus the drop across the two diodes D100 and D200: $2V_{BE}$, by design. Alternatively stated, when the L→H input transition first occurs, the base of the first Darlington transistor will be at essentially the voltage of the low-potential power rail GND, having been pulled there by discharge transistor QN90. Thus, the build-up of voltage $V_{ND1}$ will start from ground, and go very quickly to $2V_{BE}$. At that point the voltage rise at the base of Q24 becomes tied to the rate at which the constant current being generated by GEN1 can charge the capacitive element C. Note from the standard Darlington pair arrangement that the voltage at the buffer output Vout tracks the voltage $V_{ND1}$ at the base of the first member of the pair once both members of the pair are conducting; it is just down by $2V_{BE}$. Thus, $$Vout=V_{ND1}-2V_{BE}, \quad (2)$$

and $$dVout/dt=dV_{ND1}/dt=I1/C. \quad (3)$$

This means that the object has been achieved. By permitting the charging of a fixed capacitor with a fixed current, this circuit allows the central part of the rising edge to be given a fixed slope. (The fact that as the voltage on Vout approaches $V_{cc}-2V_{BE}$ it will depart from the fixed slope is not important; what is important is that the central part of the transition be controlled.)

When the input voltage changes from logic-high to logic-low, and thus terminates the current sourcing, the discharge of the pull-up transistors occurs through discharge transistors QN90 and QN9. At the same time, the voltage on the capacitive element C is discharged directly through transistor QN1.

Figure 2:
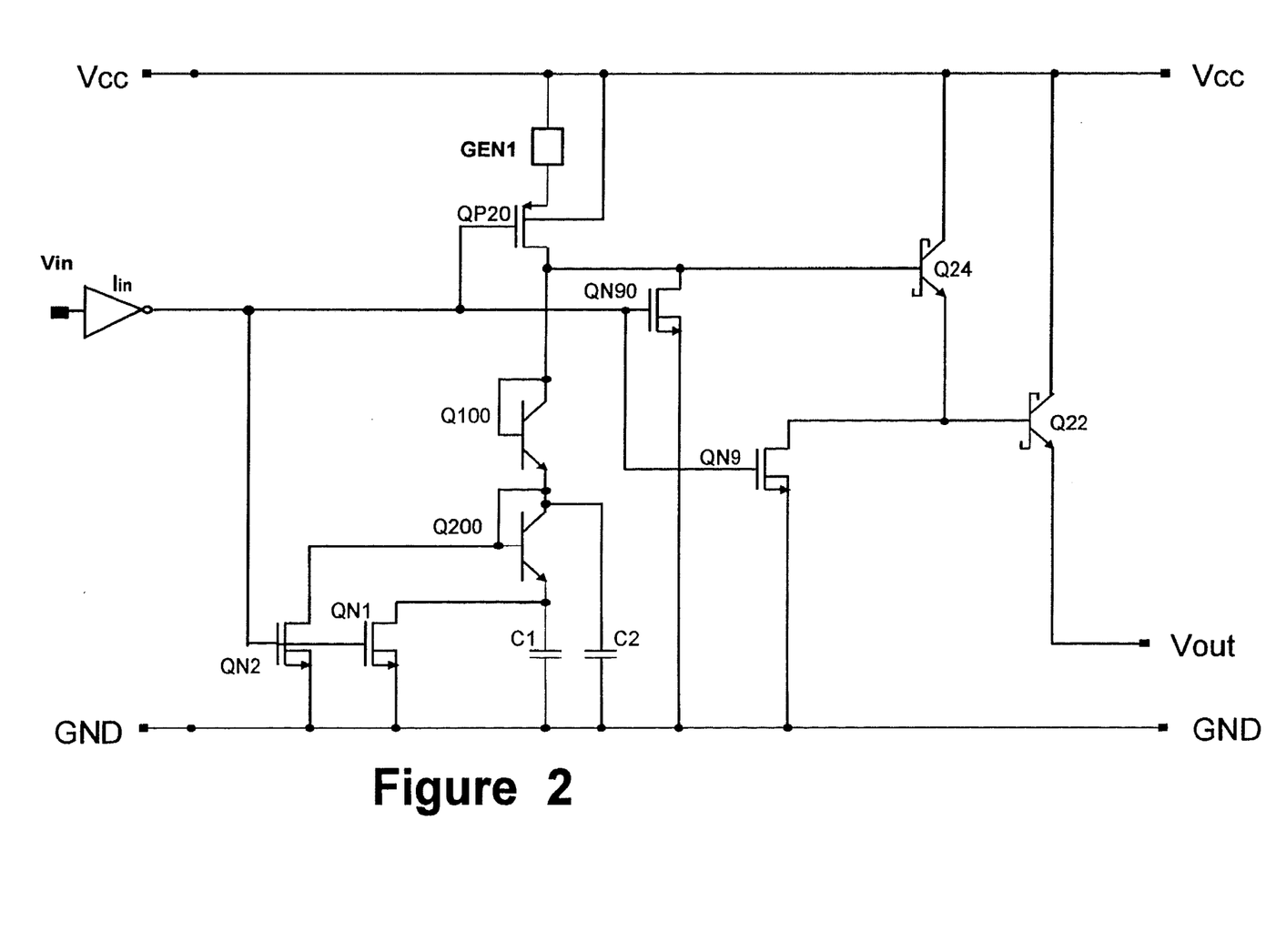
FIG. 2 depicts a particular variation/refinement of the basic pull-up sub-circuit of the present invention.

FIG. 2 shows the pull-up circuit of the present invention with an explicit switching mechanism—i.e., a switch transistor QP20—and also a variation in that part of the circuit dealing with the capacitive element. It shows the single capacitive element split into two elements charged by different branches, and the diodes D100 and D200 replaced by diode-wired transistors Q100 and Q200 (as a means of ensuring the similarity between those diode characteristics and the base-emitter junctions of the Darlington transistors). Initially—at the instant that the input voltage Vin makes its L→H transition—there will be no voltage drop across either of the capacitors C1 and C2, they having been pulled to GND by transistors QN1 and QN2, respectively, during the period that the input voltage was logic-low.

With the bifurcated capacitance arrangement, the voltage at the base of Q24 will rise quickly (not being loaded down by capacitance) only up to $V_{BE}$. At that point the diode-wired transistor Q100 begins to conduct and further rises in voltage are limited by the charging capacitor C2. Thus, after its initial rapid rise to $V_{BE}$, the voltage on the base of Q24 increases linearly according to $$dV_{ND1}/dt=I1/C2, \quad (4)$$

since the charging current will have reached its fixed regime by the time that C2 has started charging. As the increasing voltage $V_{ND1}$ on the base of the first Darlington transistor reaches $2V_{BE}$, current begins to flow through Q200, and the subsequent charging of $V_{ND1}$ is now loaded by both capacitors C1 and C2. This means that from this point on, until the voltage approaches $V_{cc}$, the voltage $V_{ND1}$ at the Darlington input node varies as $$dV_{ND1}/dt=I1/(C_2+C_1). \quad (5)$$

The presence of the Darlington pair governing the output voltage Vout ensures that Vout will rise at the same rate, i.e., that $$dV_{out}/dt=I1/(C_2+C_1), \quad (6)$$

once the voltage at the base node of Q24 has reached $2V_{BE}$. This results in an edge rate that is, to a large extent, independent of load. By appropriate design of the current generator establishing the current I1 the output edge rate—i.e., the slew rate-can also be made largely independent of fluctuations in the power supply voltage and variations in the operating temperature.

To complete the general discussion of the edge-controlled pull-up stage of the present invention, it is noted that FIG. 2 also shows the circuit elements provided to stop the current sourcing when the input voltage $V_{in}$ changes back to logic-low, i.e., makes the H→L transition. The resulting logic-high output from the inverter Iin causes transistor QP20 to turn off, interrupting the current charging the Darlington input node. At the same time, this logic-high signal turns on QN90, effectively pulling the Darlington input node to ground. The Darlington output transistor Q22 is discharged separately through QN9, also turned on by the logic-high output from the CMOS inverter. Concurrently, the capacitors C1 and C2 are discharged by transistors QN2 and QN1, respectively.

Edge-Controlled Pull-Down Stage

Figure 3:
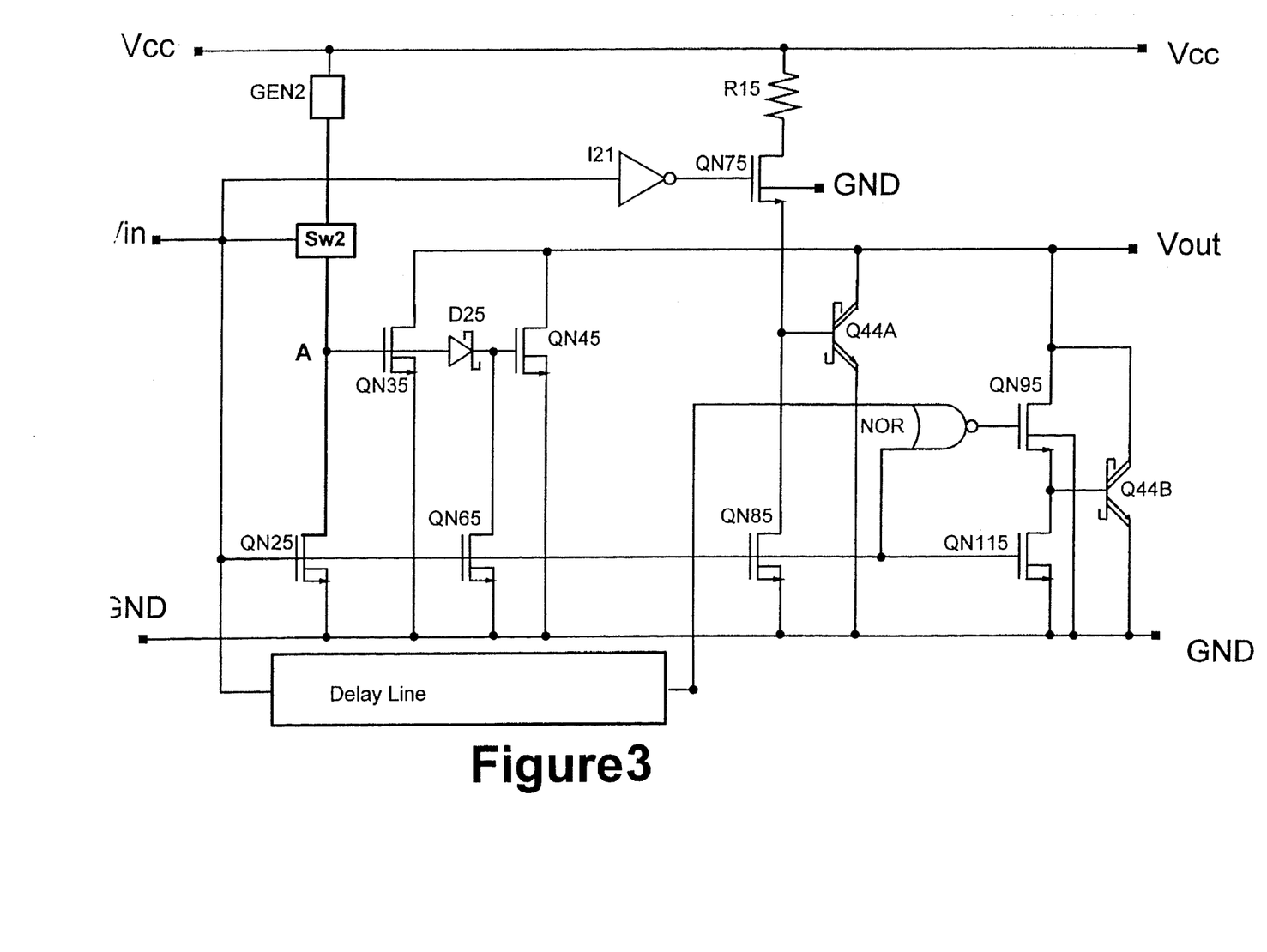
FIG. 3 depicts the main features of the pulldown sub-circuit of the present invention.

The essence of the pull-down stage of the present invention is depicted in FIG. 3. In addition to the falling-edge-rate control, this approach will provide for active control of the propagation delay. This circuit also provides higher current-sinking-capability than the prior art for any given level of load capacitance. Finally, this design entails lower power loss for any given level of current sinking, in comparison with the prior art. (This may be stated in terms of the ratio $I_{oL}/I_{ccL}$ being higher for this circuit than it is for the prior art.) This new pull-down circuit uses the same basic approach for controlling edge rate as the pull-up circuit just set out: namely, a fixed current charging a determined capacitance. In the case of the pull-down circuit, however, the capacitance is the parasitic capacitance of one or more MOS transistors. As with the pull-up circuit, the regulated current flow is turned on and off with a switch, Sw2 in this case, coupled to the input. Also as before, a variety of known techniques may be used to implement a switch Sw2 with properties as defined implicitly below.

With continuing reference to FIG. 3, consider the input voltage at Vin to undergo an H→L transition. This turns on switch Sw2, initiating a constant controlled current I2 from the current generator GEN2. This results in the voltage $V_{G35}$ at the gate node of QN35 changing at a fixed rate $$dV_{G35}/dt = I2/C35, \qquad (7)$$

where C35 is the parasitic capacitance associated with the gate node of transistor QN35, the first MOS pull-down transistor. Once the gate voltage $V_{G35}$ reaches the turn-on threshold of QN35, that transistor turns on and begins sinking current from the output node Vout of the buffer. This gradual onset of current sinking is further implemented by a second MOS pull-down transistor QN45 that, because of the delaying diode D25 will began to sink current a short time after QN35 does. (I.e., because of diode D25 the current from GEN2 must increase the voltage at node A by an amount equal to the drop across forward-biased diode D25. As will be seen below, D25 has a second function to serve.) Note that the string of NMOS transistors QN25, QN65, QN85, and QN115 are all blocking during the commencement of current sinking. At a time somewhat more than T following the L→H transition at Vin, first pulldown driver transistor QN75 will turn on, providing base drive to the first bipolar pulldown transistor Q44A, a high-current-capacity transistor. Here T is the delay introduced by inverter I21. (It is more generally the unit inverter delay, assumed to be the same for all individual inverters in this circuit.) By this time, because of the gradual turn-on of the current sinking by means of the two MOS pull-down transistors QN35 and QN45, the falling output edge has been lengthened past the point where the potential for ground bounce exists. Thus it is appropriate to introduce the high-current capacity bipolar transistor Q44A into the current-sinking circuit. This results in the turn-on of pulldown transistor Q44A occurring a fixed interval of time following the turn-on of the MOS pulldown section-QN35, QN45. This delay also ensures that no static current ($I_{ccl}$) flow occurs through QN75 and QN85. This sequence is to guard against output loads which are of very low capacitive impedance, such that without a controlled edge rate the switching of the bus from logic-high to logic-low could proceed too rapidly. At the other extreme will be a bus which presents a highly capacitive load to the buffer, one which therefore may not be switched fast enough with the current-sinking ability of the two MOS pulldowns plus bipolar transistor Q44A. Therefore, to counteract the stepout in propagation delay which could otherwise be caused by heavy capacitive loads or low impedance transmission lines being coupled to the common bus, the pull-down sub-circuit of the present invention is provided with a second heavy-duty bipolar pulldown transistor—Q44B— and a means for turning it on after a certain delay following the H→L transition at the input Vin, in case the output node has not yet been pulled down completely to logic-low. Note the NOR gate NOR with two inputs, one directly from Vin, the other from Vin following a delay line. Following a delay T after the H→L transition at the input Vin, both inputs to NOR will be logic-low, with the result that a logic-high signal is applied to QN95, turning the latter on. Note that prior to the L→H transition of Vin the base of Q44B would have been at GND, by virtue of discharge transistor QN115. Because of the isolation of the base of Q44B, that base node will remain at GND until the turnon of driver transistor QN95. The turnon of Q44B, and the consequent addition of its high current capacity to the pulldown circuit, depends upon the discharging Vout still being more than approximately $V_{BE}$ above GND. Otherwise, turning on QN95 will not provide sufficient base drive to Q44B to turn that transistor on. In those situations where the contingency is met, Q44B will assist in the pulling down of Vout until that node is down to approximately $V_{BE}$ above GND, at which point Q44B will cut out. By that point, the critical part of the falling edge will have been traversed. The first bipolar pulldown transistor Q44A will continue to discharge Vout until it too turns off with Vout about 0.4 volts above GND. Because of the continuing conduction by the MOS pulldown transistors Vout may ultimately be pulled all of the way to the voltage of the low-potential power rail GND.

The MOS/bipolar combination of pulldown transistors has a benefit at the subsequent L→H transition as well. When Vin makes that transition, the string of discharging transistors QN25, QN65, QN85, and QN115 all turn on. Three of these transistors are essentially the same, and with a relatively high current capacity; QN65, however, has a low current capacity. The result is that first MOS pulldown transistor QN35, first bipolar pulldown transistor Q44A, and contingent pulldown transistor Q44B have their control nodes discharged immediately, with the consequence that these three transistors begin blocking immediately. Second MOS pulldown transistor QN45, however, has its gate node discharged slowly (because of the smallness of discharge transistor QN65 and the presence of the blocking diode D25). This ensures that the initial part, of the transition of Vout from logic-low to logic-high is softened and hence less prone to ringing and other transition-related ills.

In addition to the transition-waveform shaping permitted by the combination of MOS and bipolar transistors in the pulldown circuit of the present invention, this combination also provides an effective means of temperature compensation, in particular, a means of maintaining a high pulldown-current-capacity across the specified temperature range. It is well-known that the current capacity of a given bipolar transistor with a given base current decreases monotonically with falling temperature and that, qualitatively at least, the current capacity of a given MOS transistor has the opposite temperature dependence. By playing these temperature dependencies off against one another, the pulldown circuit configuration of the present invention can provide a high level of temperature independence for the falling edge rate without any specific control devices. It just depends on sizing the MOS and bipolar pulldown transistors (and selecting the bipolar transistor base current). A particular way of doing this involves choosing relative sizes so that the MOS pulldown current capacity at room temperature is equal to that of the single bipolar transistor Q44A. An alternative would be to equate the MOS pulldown capacity with the total potential bipolar current capacity, where the contingent transistor Q44B is included as well. It can be seen that a wide range of such matchings can be utilized depending on the particular use to which the buffer is to be placed. Note that this technique permits output buffers to be designed with a significantly lower output capacitance for any given current-capacity, in contrast with output buffers which have pure MOS pulldown stages. Furthermore, because it is possible to use relatively small bipolar pulldown transistors, given the presence of the MOS pulldowns, the power dissipation can also be kept lower than would be the case for buffers with pure bipolar pulldown stages.

Figure 4:
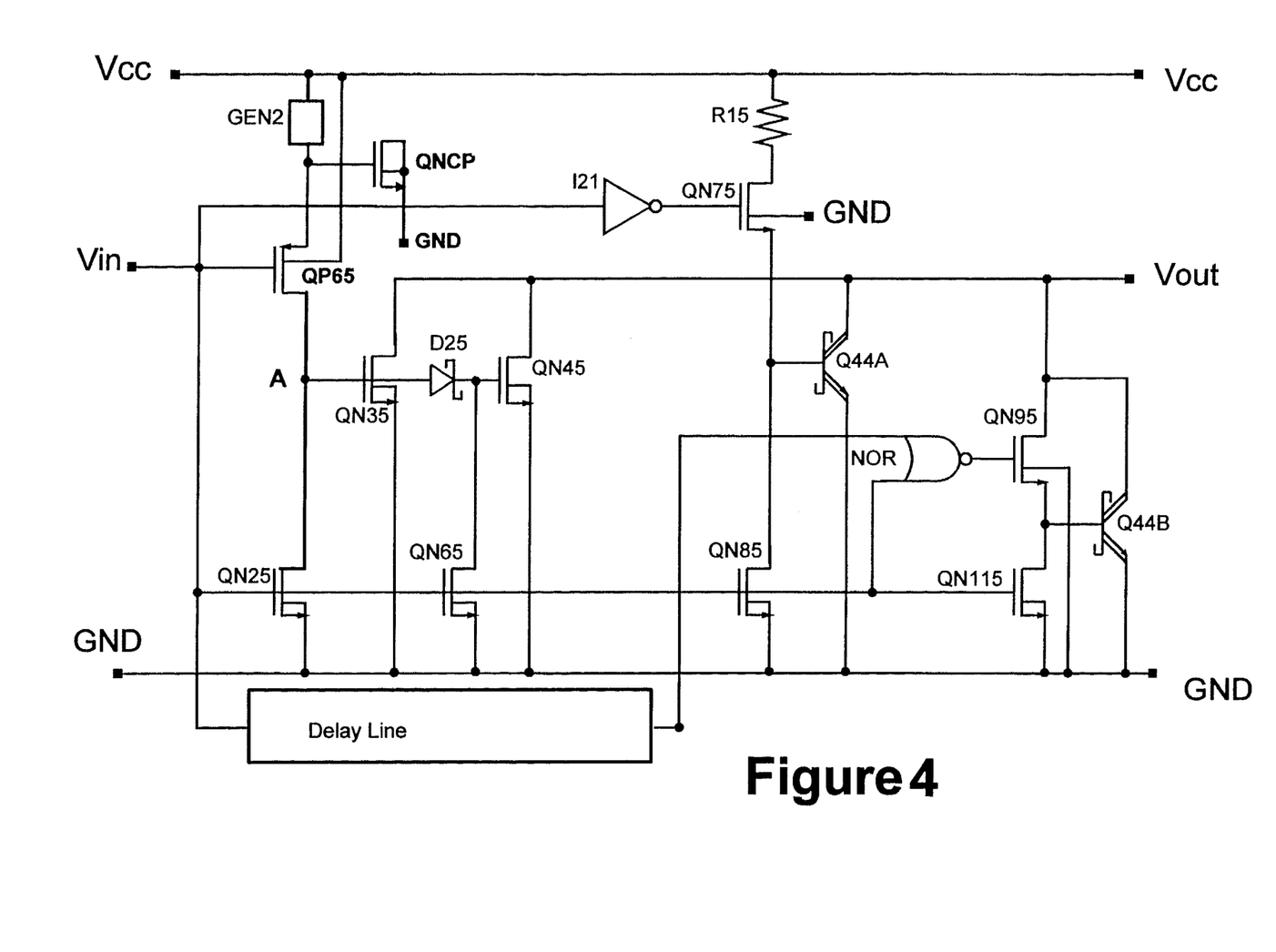
FIG. 4 depicts a particular variation/refinement of the basic pulldown sub-circuit of the present invention.

There are many additional refinements which can be supported by the basic pulldown circuit of the present invention as just set out. For example, FIG. 4 shows a PMOS transistor QP65 to have been introduced for the switch Sw2 and also an additional current source operating in parallel with the current generator GEN2. When the input voltage Vin makes the L→H transition and the switch transistor QP65 turns on as a consequence, the nominally constant current provided by current generator GEN2 will initially be augmented by a flow from the discharge of capacitor-wired transistor QNCP. To generalize the expression for the current charging the gate node voltage of QN35, the constant current I2 in equation (7) above can be replaced with $I_{G35}$, so that the equation becomes $$dV_{G35}/dt = I_{G35}/C35, \quad (8)$$

where in this instance $I_{G35}$ is the generated current I2 augmented by a transient current contribution coming from the discharging of QNCP—and flowing to the gate of QN35. The capacitor QNCP is of course charged up to a full rail-to-rail voltage drop during the period that switch transistor QP65 is off. This means that $V_{G35}$ can be made to rise more quickly to the turn-on threshold for QN35. Similarly the turn-on of QN45 is hastened, though with the delay incident to the diode D25 being in line. This controlled turn-on of transistors QN35 and QN45 helps reduce ground bounce while controlling the falling edge rate, as before and the remainder of the functioning of the circuit of FIG. 4 is the same as that of the circuit of FIG. 3.

DETAILED DESCRIPTION OF THE PREFERRED EMBODIMENT

Pull-up Sub-circuit

Figure 5:
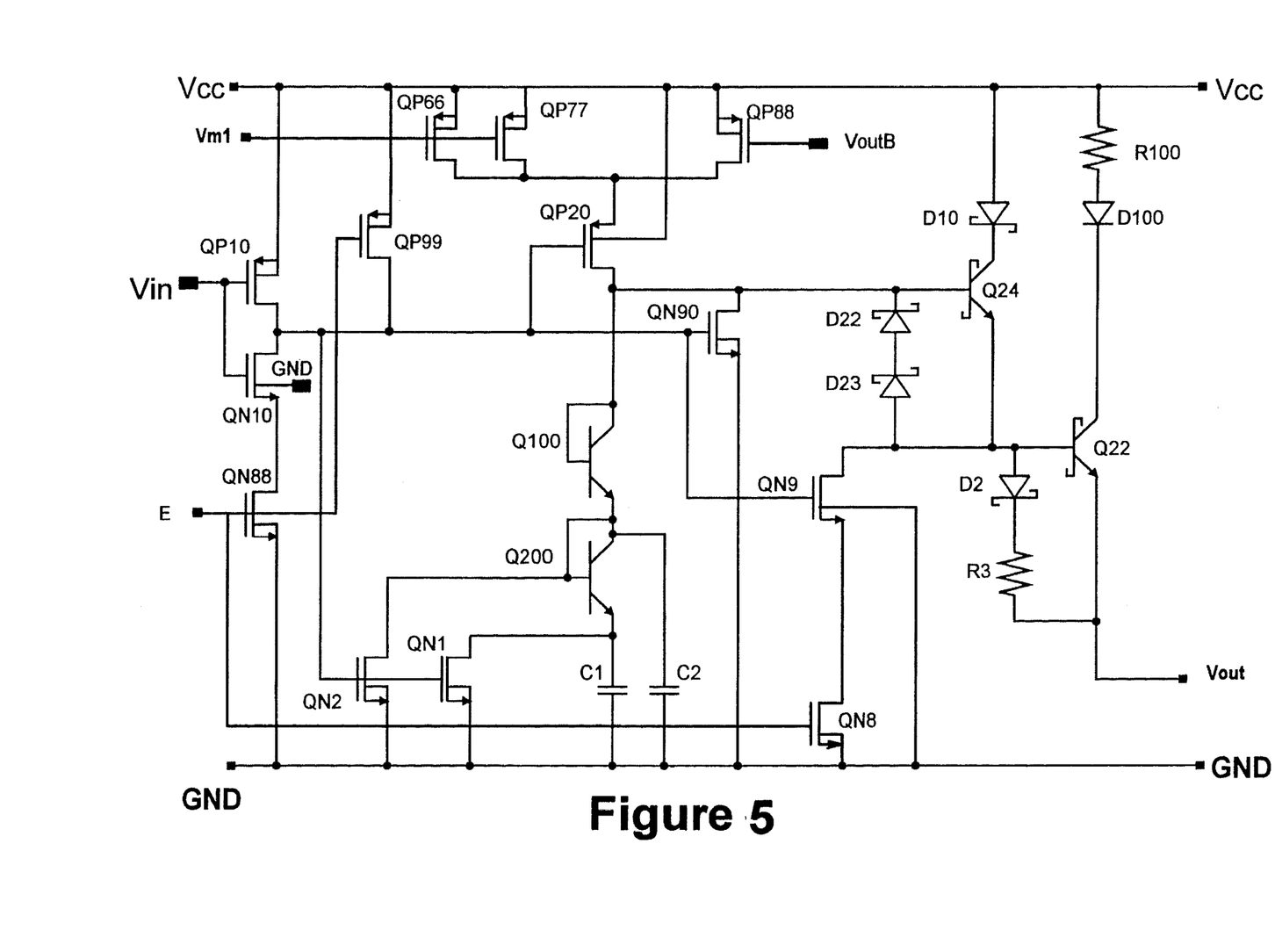
FIG. 5 shows the three-state BiCMOS circuit constituting the preferred embodiment of the pull-up sub-circuit of the present invention.

FIG. 5 shows the main features of the three-state buffer constituting the preferred embodiment of the pull-down control of the present invention. (Such peripheral aspects normally included on such a buffer, including ESD protection and Miller Killer circuits are not shown.) As can be seen, it differs from the more general circuits presented in FIGS. 1 and 2 of the SUMMARY by virtue of its enabling circuitry, its explicit circuit for the current generator identified only as GEN1 earlier, and the additional transistor QP88 controlled by a signal designated VoutB.

The current generator for the pullup circuit of the Preferred Embodiment is a current mirror made up of mirror transistors QP66 and QP77 controlled by mirror voltage Vm1. Vm1 in turn is established by a circuit external to the buffer but still on the same chip and utilizing MOS transistors processed in the same way as QP66 and QP77. This mirroring circuit can be designed by well-known techniques so as to ensure that the current I1 generated in the buffer is independent of operating temperature, manufacturing vagaries, and power supply fluctuations. (I.e., any changes in the operating characteristics of QP66 and QP77 will be mirrored in the circuit determining Vm1 in such a way that the latter itself changes so as to compensate for the changes in QP66 and QP77 and so maintains constant the current passing through these transistors.) It is to be noted that even within the Preferred Embodiment, the current mirror can be effected with fewer or with more transistors in the role of QP66 and QP77.

The current of interest here is that passing through switching transistor QP20, since that is the current that charges capacitors C1 and C2 and hence establishes the base voltage of Q24, the first member of the Darlington pair constituting the output pull-up circuitry for the buffer. It is noted that: by the nature of the circuit, the current through QP20 is not constant; in the extreme case, with QP20 turned off, there is no current at all passing through it and, ultimately, as the source node of QP20 is raised in voltage to that of the high-potential power rail, the current will again cease. The important point is that for the crucial part of the L→H transition at Vout the current is fixed at a known and determinable value, and hence the base voltage of Q24 is rising at one of two known rates.

Consider the sequence which occurs when, with enabling input E logic-high so as to put the buffer in its active mode, the input voltage Vin switches from logic-low to logic-high. This causes the output from the QP10, QN10 inverter to switch from logic-high to logic-low, turning on switching transistor QP20. More accurately, this switching-on of QP20 occurs at a time T following the transition at Vin, where T is the delay introduced by the CMOS input inverter QP10, QN10. With QP20 conducting, the fixed current I1 established by the (Vm1, QP66, QP77) mirror passes through QP20 and through the diode-wired transistor Q100 so as to charge capacitor C2. The voltage at the base of Q24 during this first regime will be the voltage across C2 plus the drop $V_{BE}$ across the forward-biased base-emitter junction of Q100. When the voltage across the charging C2 capacitor reaches $V_{BE}$—i.e., when the voltage at the base of Q24 reaches $2V_{BE}$—current will also flow through the diode-wired transistor Q200. This diversion slows the rate at which the Darlington node—the base of Q24— changes in voltage and hence the rate at which the output edge rises.

In the Preferred Embodiment, an additional source of Darlington drive current is provided by delayed driver transistor QP88 which is turned on by the signal VoutB which, as will be seen below, is the inverse of the input voltage Vin and for which transitions are delayed by a time 5T from those of Vin. Thus, at a time 5T following the switching of Vin from logic-low to logic-high, VoutB will switch to logic-low and turn on QP88 hard. This serves to lock the base of Q24 at $V_{cc}$ and hence to hold Q24 on for the duration of the time that Vin is logic-high. In other words, the current mirror (Vrn, QP66, QP77) serves to establish the rising edge rate bringing Vout up to logic-high, and QP88 serves to maintain Vout at logic-high, sourcing current for the duration of the time that Vin is logic-high. The presence of QP88 ensures that regardless of the rate at which the limited fixed current I1 is changing Vout from logic-low to logic-high, the output (bus) transition will be completed at a time 5T following the L→H transition of Vin.

Pull-down Sub-circuit

Figure 6:
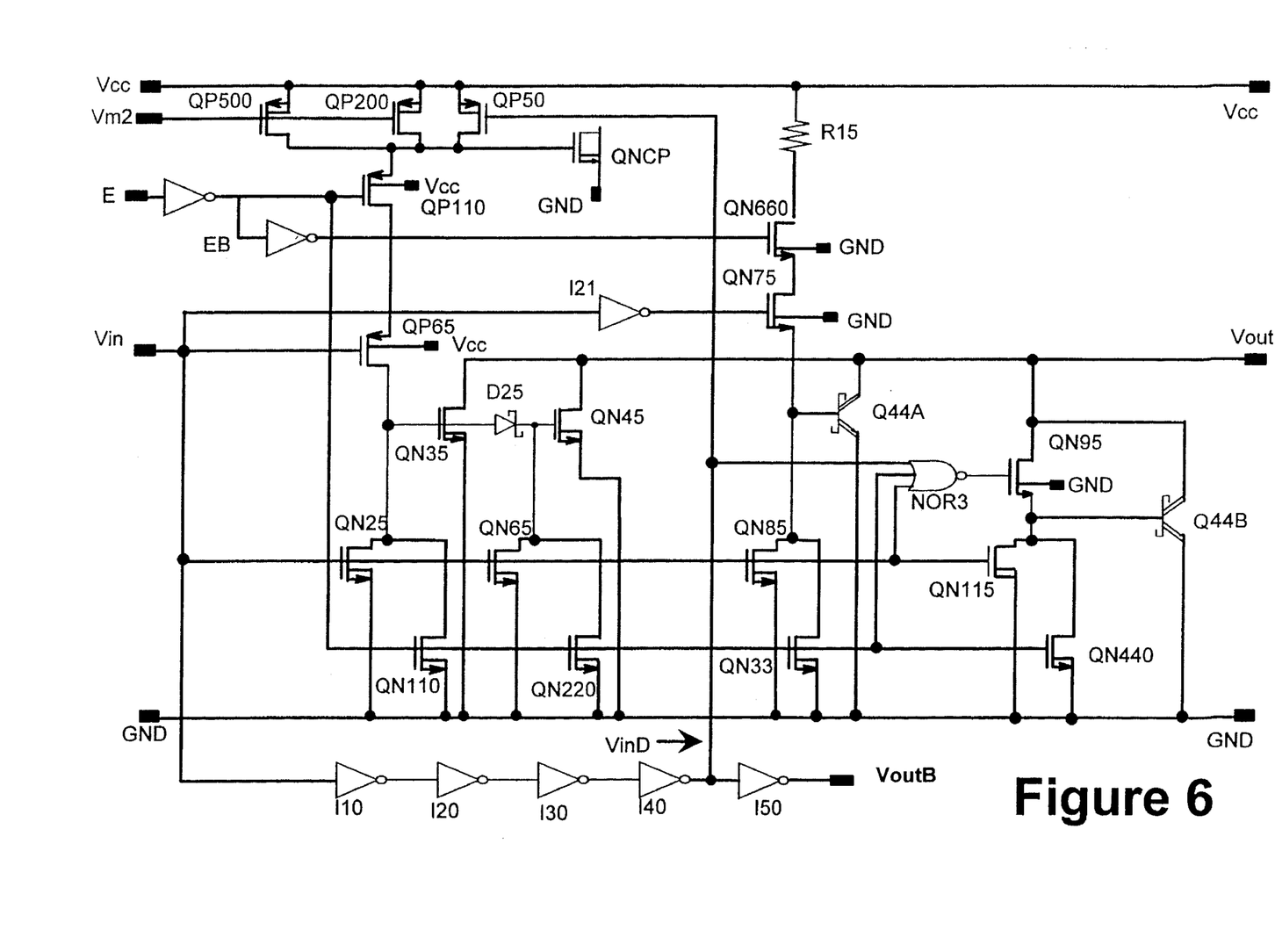
FIG. 6 shows the three-state BiCMOS circuit constituting the preferred embodiment of the pull-down sub-circuit of the present invention.

FIG. 6 shows the pull-down section of the three-state output buffer constituting the Preferred Embodiment of the present invention. For present purposes, assume that an enabling signal is present at enabling input E. As was the case with the pull-up sub-circuit, the current generator of the present invention is supplied by a current mirror: (Vm2, QP200, QP500). In the preferred embodiment, Vm2 is generated separately from the mirroring control voltage associated with the pull-up circuit: Vrn1. As can be seen from FIG. 6, there are, in the control current branch of the Preferred Embodiment (passing through QP65) sources of current in addition to the mirror-generated current, I2. These additional sources come into play at the beginning and ending of the pull-down transition, as will now be described.

Switching transistor QP65 turns on immediately when Vin switches from logic-high to logic-low (i.e., there is not the delay T between Vin switching and the current switch turning on as there was with the pull-up circuit discussed in the previous section.) In addition to the regulated current I2, there will be a contribution to the QP65 current—written more generally as $I_{65}$—from the capacitor-wired NMOS transistor QNCP; during the period that QP65 is off (i.e., while there is a logic-high input signal) the mirroring transistor pair QP500, QP200 will continue to couple QNCP to $V_{cc}$ and thus ensure that QNCP has a full rail-to-rail charge when QP65 is turned on. This results in an initial bolus of current charging the gate node of the first MOS pulldown transistor QN35, and then a short time later, the gate of the second MOS pulldown transistor QN45. This will cause the gate voltage of QN35 to rise to its threshold level rapidly, causing first MOS pull-down transistor QN35 to turn on rapidly. During this period the gate of second. MOS pull-down transistor QN45 is also charging. Because of the series delay diode D25 through which $I_{65}$ charges the gate of QN45, that transistor's turn-on is delayed with respect to that of QN35. This controlled turn-on of QN35 and QN45 helps reduce ground bounce while also controlling the falling output edge. One inverter delay T following the controlled turn-on of the MOS pulldown transistors, the first driver transistor QN75 is turned on, providing base drive current for the first bipolar output pulldown transistor Q44A, and hence turning on this high-current-capacity sink coupled to the buffer output node, i.e., to the common bus.

As set out in the SUMMARY a second, contingent bipolar pull-down transistor— Q44B—is provided and turned on a time determined by a Delay Line which, in the preferred embodiment is simply a series of four inverter stages, each with a delay similar to that provided by inverter I21. The collector of Q44B is coupled to Vout, and its emitter to the low-potential power rail. The base of Q44B is coupled to Vout through contingent driver transistor QN95, which in turn has its control gate coupled to Vin through a NOR gate and the delay train I10–I40. I.e, the delayed input signal VinD is one of the three inputs to the NOR gate NOR3 shown in FIG. 6. One of the other two NOR gate inputs comes directly from Vin, and the third is from the enabling input E, held at logic-low for the active mode of the buffer. Thus, when VinD falls to logic-low a time 4T following the H→L switching of Vin, the gate NOR3 sends a logic-high signal to the gate of second driver transistor QN95, turning it on hard. If the output Vout is still significantly above (i.e., by more than about $V_{BE}$) logic-low at this time, Q44B will receive base drive current through QN95 and will turn on, resulting in a big boost in pull-down current capacity. The boost will only last until Vout has been reduced to about $V_{BE}$.

Note that at the same time the delayed input signal VinD is sent to the NOR gate NOR3, it is also applied to the gate of supplementary transistor QP50, turning that transistor on hard. This ensures that the gates of the pull-down transistors are pegged at logic-high for the duration of the time that Vin is logic-low, even if the controlled current through the mirror-generator (QP500, QP200) has not been sufficient to charge the gate of QN35 up to $V_{cc}$ by this point. Thus, as with the pull-up sub-circuit of the present invention, there is a limiting time interval established for the H→L transition of Vout.

As set out in the SUMMARY, the relative sizes of the MOS and bipolar pulldown transistors—and the bipolar base currents—are selected so that the respective current capacities of the MOS and bipolar transistors are roughly equal at room temperature. Since the sizes needed to establish this relationship are dependent upon particular manufacturing procedures used, the condition is best stated in this manner rather than with the physical sizes of the transistors.

The respective aspect ratios chosen for the discharge transistors in the Preferred Embodiment are as follows: QN65-7/4; all the rest (i.e., QN25, QN85, QN115, etc.)-25/ 1. This ensures the relatively gradual turnoff of the current sinking during a L→H transition; the MOS pulldown transistor QN45 ceases conducting more gradually than the others, because of the delay in discharging its control node below its threshold voltage.

I claim:

1. An output buffer circuit comprising a Darlington pair output pullup stage and a means for providing a staged voltage increase to an input base node of said Darlington pair, said staged voltage increase comprising a first, fast increase up to a first predetermined voltage level, followed by a second, slower increase up to a second predetermined voltage level, said means for providing a staffed voltage increase including at least one fixed capacitance means charged with a constant current, and said staged voltage increase means further including a means for delaying the charging of said fixed capacitance, said means for delaying the charging of said fixed capacitance comprising current-voltage characteristics similar to the base-emitter junctions of the transistors of said Darlington pair.

2. Circuit as claimed in claim 1 wherein said constant current is produced by a current mirror coupled between a high-potential power rail and a first base node of a first Darlington transistor of said Darlington pair output pullup stage.

3. An output buffer circuit comprising a Darlington pair output pullup stage and a means for providing a staged voltage increase which includes a fixed capacitance charged with a constant current produced by a current mirror coupled between a high-potential power rail and a first base node of a first Darlington transistor of said Darlington pair output pullup stage, and a first diode connected between said first base node and a high side of a first charging capacitor of said fixed capacitance, wherein a low side of said first charging capacitor is coupled directly to a low-potential power rail.

4. Circuit as claimed in claim 3 wherein said first charging capacitor is connected in parallel with a second diode, said second diode being connected in series with a second charging capacitor wherein one side of said second charging capacitor is connected directly to said low-potential power rail.

5. Circuit as claimed in claim 4 wherein said first diode is a first diode-wired transistor and wherein said second diode is a second diode-wired transistor.

6. Circuit as claimed in claim 5 wherein said current mirror includes one or more parallel-wired MOS mirror transistors coupled between said high-potential power rail and a high side of a first switch, wherein all said mirror transistors are controlled in common by a first mirror control voltage generated using MOS transistors external to said buffer and where said first mirror control voltage is coupled to gate nodes of all of said mirror transistors.

7. Circuit as claimed in claim 5 wherein said first switch is interposed between said current mirror and said base node of said first Darlington transistor and wherein said first switch is activatable by an input voltage applied to an input node of said buffer.

8. Circuit as claimed in claim 7 wherein said first switch is a MOS transistor switch coupled between a low side of said current mirror and said base node of said first Darlington transistor and wherein a gate node of said MOS transistor switch is coupled to said input node.

9. Circuit as claimed in claim 8 wherein an inverter stage is interposed between said input node and said gate node of said MOS transistor switch.

10. Circuit as claimed in claim 9 wherein a collector node of said first Darlington transistor is coupled to said high-potential power rail, wherein an emitter node of said first Darlington transistor is coupled to a base of a second Darlington transistor, wherein a collector node of said second Darlington transistor is coupled to said high-potential power rail, wherein an emitter node of said second Darlington transistor is coupled to a buffer output node, and wherein a base of said second Darlington transistor is coupled to said buffer output node.

11. Circuit as claimed in claim 10 wherein a delayed driver transistor is coupled between said high-potential power rail and said high side of said first switch, said delayed driver transistor being activated a certain time after said input voltage is applied to said input node, and wherein a control node of said delayed driver transistor is coupled to said input node through a delay line.

12. Circuit as claimed in claim 11 wherein said delayed driver transistor is a MOS transistor.

13. An output buffer circuit comprising a controlled pullup circuit, wherein said controlled pullup circuit includes (a) a Darlington pair output stage having a first Darlington transistor and a second Darlington transistor;
(b) a control stage for controlling said Darlington pair output stage, said control stage having
  (i) a current generator capable of passing a constant current between a high-potential power rail and a generator output,
  (ii) a PMOS switch transistor in series with said generator output such that when said switch is activated said constant current flows and when said switch is deactivated said constant current ceases, wherein a gate node of said switch transistor is coupled to a buffer input node designed to receive logic-high and logic-low voltages,
  (iii) a first diode-wired transistor similar in junction characteristics to said first Darlington transistor wherein a collector node of said first diode-wired transistor is coupled through said PMOS switch transistor to said output of said generator and wherein an emitter node of said first diode-wired transistor is coupled directly to a collector node of a second diode-wired transistor, wherein said second diode-wired
  transistor has junction characteristics similar to those of said second Darlington transistor,
  (iv) a first charging capacitor, wherein said first charging capacitor is connected between said emitter node of said first diode-wired transistor and a low-potential power rail,
  (v) a second charging capacitor, wherein said second charging capacitor is connected between said emitter node of said second diode-wired transistor and said low-potential power rail; and
(c) a MOS delayed driver transistor wherein said MOS transistor operation is delayed for a time after an input voltage is applied to said input node, said MOS delayed driver transistor being coupled between said high-potential power rail and a base of said first Darlington transistor, wherein a gate node of said MOS delayed driver transistor is coupled to said input node through a delay line.

14. An output buffer circuit comprising both a MOS transistor output pulldown stage and a bipolar transistor output pulldown stage, wherein said MOS transistor output pulldown stage and said bipolar transistor output pulldown stage are coupled to a buffer output node, said MOS transistor output pulldown stage comprising a first MOS pulldown transistor coupled between said buffer output node and a low-potential power rail, wherein a gate node of said first MOS pulldown transistor is coupled to a controlled-current source through a current switch activatable by a buffer input voltage applied to a buffer input node, said bipolar stage comprising a first bipolar pulldown transistor coupled between said buffer output node and said low-potential power rail and wherein a base node of said first bipolar pulldown transistor is coupled to a high-potential power rail through a first driver transistor, wherein a control node of said first driver transistor is coupled to said buffer input node, wherein a first delay cell is interposed between said control node of said first driver transistor and said buffer input node, wherein said MOS transistor output pulldown stage includes a second MOS pulldown transistor coupled in parallel with said first MOS pulldown transistor between said buffer output node and said low-potential power rail, wherein a gate node of said second MOS pulldown transistor is coupled to said controlled-current source through said current switch and also through a diode.

15. Circuit as claimed in claim 14 wherein said bipolar pulldown stage also includes a bipolar contingent pulldown transistor coupled between said buffer output node and said low-potential power rail, wherein a base node of said bipolar contingent pulldown transistor is coupled to said buffer input node through a delay mechanism.

16. Circuit as claimed in claim 15 wherein said delay mechanism includes
(a) a delay line coupled between said buffer input node and a first input to a NOR gate,
(b) a direct connection between said buffer input node and a second input to said NOR gate,
(c) a direct connection between an output of said NOR gate and said base node of said bipolar contingent pulldown transistor.

17. Circuit as claimed in claim 16 wherein said gate node of said first pulldown transistor is coupled to said low-potential power rail through a first discharge transistor, wherein said gate node of said second MOS pulldown transistor is coupled to said low-potential power rail through a second discharge transistor, wherein said base node of said first bipolar pulldown transistor is coupled to said low-potential power rail through a third discharge transistor, and wherein said base node of contingent bipolar pulldown transistor is coupled to said low-potential power rail through a rough discharge transistor, wherein said first discharge transistor, said second discharge transistor, said third discharge transistor, and said rough discharge transistor all have their control nodes connected in common to said buffer input node, and wherein said first discharge transistor, said third discharge transistor, and said rough discharge transistor are all similar in discharge current capacity and distinct from said second discharge transistor, which has a smaller discharge current capacity.

18. Circuit as claimed in claim 17 also comprising a supplementary transistor, wherein said supplementary transistor is coupled between said high-potential power rail and said current switch and where a control gate of said supplementary transistor is coupled to said buffer input node through said delay line.

19. Circuit as claimed in claim 18 also comprising a capacitive element coupled between said low-potential power rail and an output of said controlled-current source.

20. Circuit as claimed in claim 19 wherein said controlled-current source is a current mirror.

21. A method for gradually turning off current sinking in an output buffer, said method comprising using a plurality of pulldown transistors in parallel but controlled by separate control node discharge transistors, wherein said separate control node discharge transistors have a range of discharge rate capacities so as to effect turn on of each of said plurality of pulldown transistors at a different time.

22. A method as described in claim 21 wherein said plurality of pulldown transistors includes a mixture of MOS transistors and bipolar transistors.

23. A method of minimizing output capacitance in an output buffer for a given current-sinking capacity, said method comprising coupling a first transistor set in parallel with a second transistor set, said first transistor set comprising a first MOS pulldown transistor in parallel with a second MOS pulldown transistor, said second transistor set comprising a first bipolar pulldown transistor in parallel with a second bipolar pulldown transistor, and using a pulldown turn:on circuit to turn on said first MOS pulldown transistor then said second MOS pulldown transistor, followed by turning on said first bipolar pulldown transistor then said second bipolar pulldown transistor.

24. A method as described in claim 23 further comprising the step of turning on one of said bipolar pulldown transistors only if there is a failure to pull down an output of said buffer within a set time.

25. A method for producing in an output buffer a pulldown current sourcing waveform within predetermined limits regardless of output load on said buffer, said method comprising,
(a) coupling a first bipolar pulldown transistor between an output node and a low-potential power rail, coupling a base node of said first bipolar pulldown transistor to a high-potential power rail through a delayed MOS driver transistor, said delayed MOS driver transistor operation being delayed for a time after an input voltage is applied to a buffer input node, connecting a gate node of said delayed MOS driver transistor to said buffer input node through an inverting delay stage,
(b) coupling a second bipolar pulldown transistor between said output node and said low-potential power rail, coupling a base node of said second bipolar pulldown transistor to said output node through a MOS driver transistor, coupling a gate node of said MOS driver transistor directly to an output of a NOR gate, said NOR gate having a first NOR input coupled directly to said buffer input node and a second NOR input coupled to said buffer input node through a non-inverting delay line,
(c) coupling a first MOS pulldown transistor between said output node and said low-potential power rail, wherein a gate node of said first MOS pulldown transistor is coupled to said high-potential power rail through a current regulator and a current switch, wherein said current switch is activatable by said input voltage applied to said buffer input node,
(d) coupling a second MOS pulldown transistor between said output node and said low-potential power rail, wherein a gate node of said second MOS pulldown transistor is coupled to said gate node of said first MOS pulldown transistor.

* * * * *